(12) United States Patent
Yoo et al.

(10) Patent No.: US 6,797,579 B2
(45) Date of Patent: Sep. 28, 2004

(54) SEMICONDUCTOR DEVICE HAVING TRENCH ISOLATION STRUCTURE AND METHOD OF FABRICATING THE SAME

(75) Inventors: Seung-Han Yoo, Yongin-shi (KR); Jae-Min Yu, Seoul (KR); Sang-Wook Park, Seoul (KR); Tae-Jung Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/755,596
(22) Filed: Jan. 12, 2004

(65) Prior Publication Data
US 2004/0142534 A1 Jul. 22, 2004

Related U.S. Application Data (62) Division of application No. 10/243,019, filed on Sep. 13, 2002, now Pat. No. 6,740,933.

(30) Foreign Application Priority Data

Nov. 6, 2001 (KR) ........................................ 2001-68820

(51) Int. Cl.⁷ .................... H01L 21/331; H01L 21/8222
(52) U.S. Cl. ........................ 438/311; 438/353; 438/366
(58) Field of Search ................................. 438/311, 318, 438/348, 353, 359, 362, 366, 377

(56) References Cited

U.S. PATENT DOCUMENTS 6,436,751 B1 * 8/2002 Liou et al. .................. 438/211

* cited by examiner

Primary Examiner—Phuc T. Dang
(74) Attorney, Agent, or Firm—Mills & Onello LLP (57) ABSTRACT

A semiconductor device having a trench isolation structure and a method of fabricating the same are provided. The device has a trench region and an isolation structure. The trench region is disposed to define an active region at a predetermined region of an SOI substrate formed by sequentially stacking a buried insulating layer and an upper silicon layer on a base substrate. The isolation structure fills an inside of the trench region. The trench region has a deep trench region where the upper silicon layer penetrates to the buried insulating layer and a shallow trench region existing at an outside of the deep trench region. The method of forming a trench region with deep and shallow trench regions includes patterning an upper silicon layer of an SOI substrate. A trench oxide layer and a trench liner are conformally formed on a sidewall and a bottom of the trench region. The trench liner on the bottom of the trench region, the trench oxide layer, and the upper silicon layer are successively patterned to form the deep trench region where the buried insulating layer is exposed. The trench region existing at an outside of the deep trench region corresponds to the shallow trench region.

10 Claims, 7 Drawing Sheets

Fig. 1

(Prior Art)

Fig. 2

(Prior Art)

Fig. 3

(Prior Art)

Fig. 4

(Prior Art)

SEMICONDUCTOR DEVICE HAVING TRENCH ISOLATION STRUCTURE AND METHOD OF FABRICATING THE SAME

RELATED APPLICATION

This application is a divisional of U.S. application Ser. No. 10/243,019, filed on Sep. 13, 2002 now U.S. Pat. No. 6,740,933, and relies for priority upon Korean Patent Application No. 2001-68820, filed on Nov. 6, 2001, the contents of which are herein incorporated by reference in their entirety.

FIELD OF THE INVENTION

The present invention relates to a semiconductor device and a method of fabricating the same. More specifically, the present invention is directed to a semiconductor device having a trench isolation structure on a silicon on insulator (SOI) substrate and a method of fabricating the same.

BACKGROUND OF THE INVENTION

Generally, as integration level of a semiconductor device increases, both RC delay time due to parasitic capacitance and power dissipation caused by junction leakage current are greatly increased. This affects adversely not only high-speed operation of the semiconductor device, but also low electric characteristic.

Fabricating methods of semiconductor devices are recently becoming increasingly dependant on silicon on insulator (SOI) techniques. The SOI techniques may minimize both the parasitic capacitance and the leakage current, thereby realizing semiconductor devices with high-speed/low-power characteristics. An SOI substrate is formed of a base substrate, a buried insulating layer, and a silicon layer that are sequentially stacked. Since a transistor on the SOI substrate includes its source/drain region that is in contact with the buried insulating layer thereunder, there may exist neither the junction capacitance nor the leakage current at a lower portion of the source/drain region. Consequently, both the junction capacitance and the leakage current are remarkably reduced as a whole except at a portion in contact with the channel region of the device. In addition, adjacent semiconductor devices are completely insulated from each other by both the buried insulating layer and a device isolation layer. This leads to improvement in a latch-up problem of a CMOS device, thereby permitting devices to be highly integrated.

Unfortunately, however, since the silicon layer on the buried insulating layer has a thickness of 1 μm or less, in case that a conventional shallow trench isolation (STI) technique is applied to the SOI substrate, the silicon layer may suffer defects due to stress.

FIGS. 1 through 4 are cross-sectional views illustrating a conventional method of fabricating a trench isolation structure on an SOI substrate.

Figure 1:
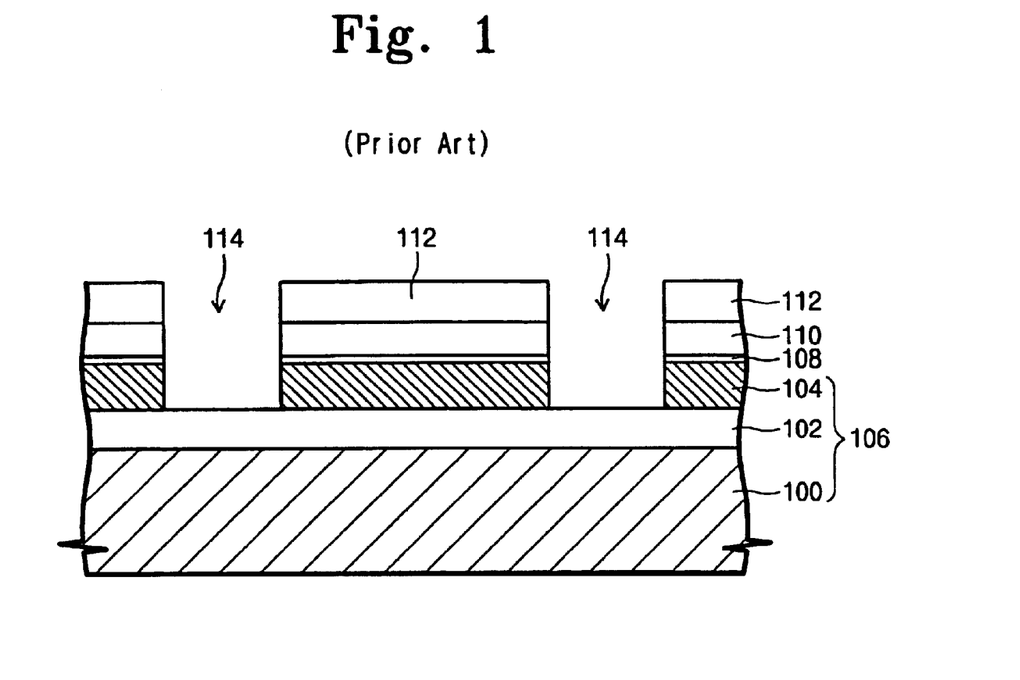
FIGS. 1 through 4 are cross-sectional views illustrating a method of fabricating a conventional trench isolation structure.
Figure 2:
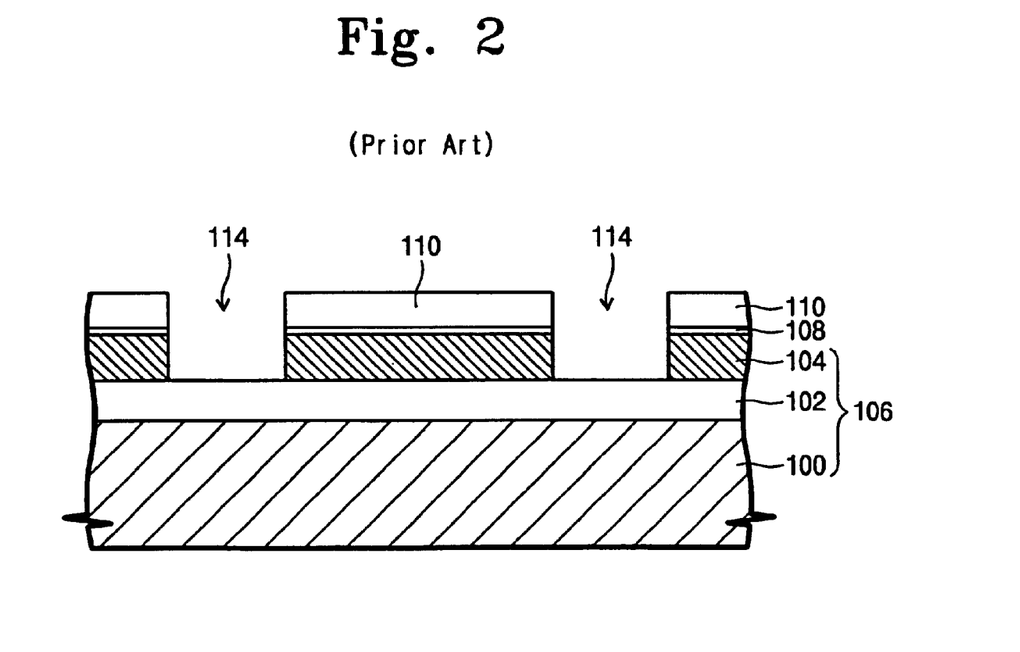

Referring to FIGS. 1 and 2, a buffer oxide layer and a hard mask layer are sequentially formed on an SOI substrate 106 that is formed of a base substrate 100, a buried insulating layer 102, and an upper silicon layer 104. The hard mask layer is normally made of silicon nitride. A photoresist pattern 112 is formed on the hard mask layer to expose a predetermined region of the hard mask layer. By using the photoresist pattern 112 as an etch mask, the hard mask layer, the buffer oxide layer, and the upper silicon layer are successively patterned to form a trench region 114. As a result, an upper silicon pattern 104, a buffer oxide pattern 108, and a hard mask pattern 110 are sequentially formed on the buried insulating layer 102. The upper silicon pattern 104 corresponds to an active region of the semiconductor device.

Figure 3:
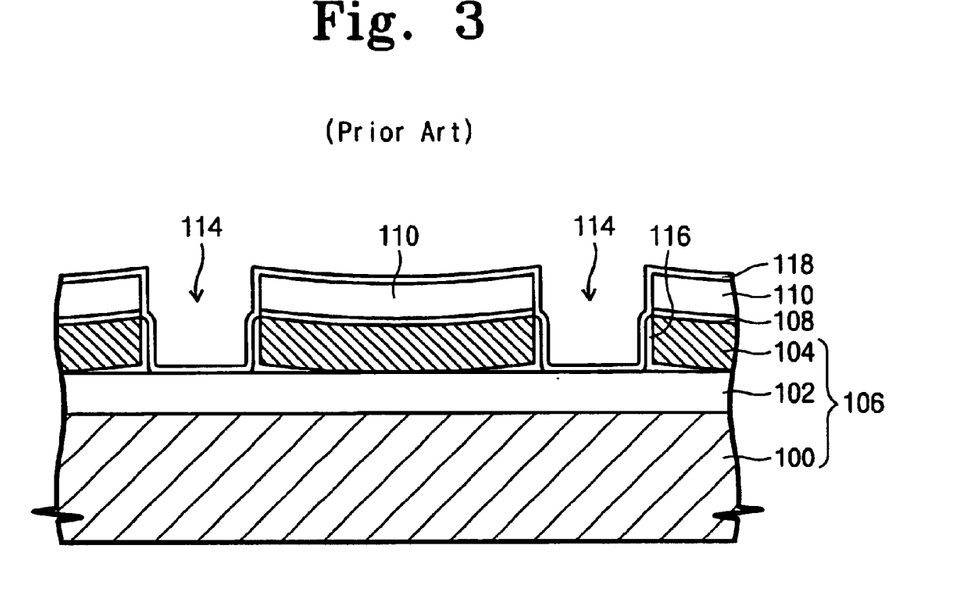

Referring to FIG. 3, sidewalls of the upper silicon pattern 104 suffer defects due to damage that occurs while the upper silicon layer is etched to forming the trench region 114. The resultant structure where the photoresist pattern 112 is removed is annealed in an oxygen ambient so as to cure the defects of the sidewalls of the upper silicon pattern 104. As a result, the sidewalls of the upper silicon pattern 104 are oxidized to form a trench oxide layer 116. A trench liner layer 118 is conformally formed on an entire surface of the resultant structure where the trench oxide layer 116 is formed.

Figure 4:
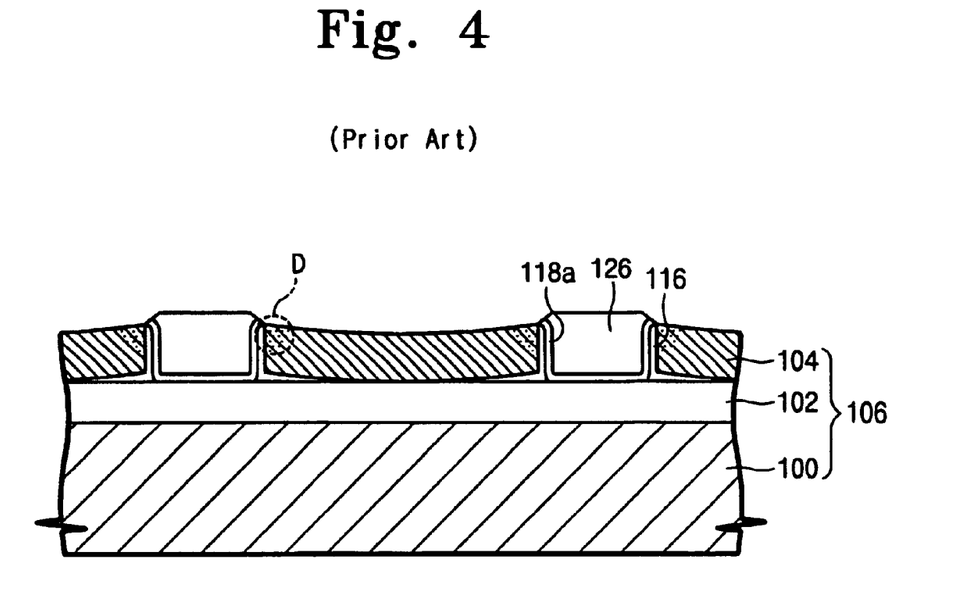

Referring to FIG. 4, a device isolation layer is formed to fill the trench region 114 on an entire surface of the resultant structure where the trench liner layer 118 is formed. The device isolation layer is polished by chemical mechanical polishing (CMP) to form an insulating layer pattern 126 filling an inside of the trench region 114. The trench liner layer 118 covering a sidewall and a top of the hard mask pattern 110, the hard mask pattern 110, and the buffer oxide layer pattern 108 are successively etched to expose the active region and also form a nitride liner 118a surrounding the insulating layer pattern 126. The trench oxide layer 116, the nitride liner 118a, and the insulating layer pattern 126 form an isolation structure.

As described above, according to the conventional method, annealing is done to cure the etching damage that the sidewalls of the upper silicon pattern 104 suffers while forming the trench region 114. In the annealing step, atoms of oxygen are diffused into an interface between the upper silicon pattern 104 and the buried insulating layer 102, resulting in oxidation of a bottom edge of the upper silicon pattern 104. The oxidation of the silicon layer leads to formation of a silicon oxide layer, which is expanded about twice as much as the silicon layer. When the edge of the bottom of the upper silicon pattern 104 is oxidized, tensile stress is applied to the upper silicon pattern 104. This causes stress-induced defects to the upper silicon pattern 104. Unlike a transistor on a single crystalline silicon substrate, a transistor on an SOI substrate includes its source-drain region that is in contact with a buried insulating layer thereunder. In case of an SOI semiconductor device, a defect D of an upper edge of an active region causes improper operation of the device and also an increase in leakage current, as shown in FIG. 4. Therefore, it is imperative to develop a method for minimizing defects of the upper edge of the active region.

SUMMARY OF THE INVENTION

The present invention provides a semiconductor device having a trench isolation structure and a method of fabricating the same that can prevent a silicon layer from suffering tensile stress so as to reduce defects of an active region.

The present invention also provides a semiconductor device having a trench isolation structure and a method of fabricating the same that may minimize both leakage current and misoperation of the device.

According to the present invention, the semiconductor device comprises a trench region and an isolation structure. The trench region is disposed to define an active region at a predetermined region of a silicon on insulator (SOI) substrate formed by sequentially stacking a buried insulating layer and an upper silicon layer on a base substrate. The isolation structure fills an inside of the trench region. Shown by a cross-sectional view of the trench region, the trench region comprises a deep trench region and a shallow trench region. The deep trench region is where the silicon layer penetrates to the buried insulating layer and the shallow trench region exists at an outside of the deep trench region. That is, the trench region has a stepped sidewall. The isolation structure includes a trench oxide layer, a trench liner, and an insulating layer pattern. The trench oxide layer and the trench liner cover a bottom and a sidewall of the shallow trench region. The insulating layer pattern fills an inside of the trench region covered with the trench liner.

A method of fabricating the semiconductor device comprises sequentially forming a buffer oxide layer and a hard mask layer on an SOI substrate formed by sequentially stacking a buried insulating layer and an upper silicon layer on a base substrate. The hard mask layer, the buffer oxide layer, and the silicon layer of a predetermined depth are successively patterned to form a trench region in the upper silicon layer. A bottom and a sidewall of the trench region are thermally oxidized. A trench liner is formed to conformally cover the bottom and the sidewall of the trench region. The trench liner on the bottom of the trench region and the upper silicon layer are successively patterned to form a modified trench region. Shown by a cross-sectional view of the trench region, the modified trench region includes a deep trench region where the buried insulating layer is exposed and a shallow trench region existing at an outside of the deep trench region. An insulating layer pattern is formed to fill an inside of the modified trench region. Thereafter, the hard mask layer and the buffer oxide layer remaining on the upper silicon layer are removed.

The insulating layer pattern and the trench liner covering both the sidewall and bottom of the trench region correspond to a device isolation layer defining an active region.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 5:
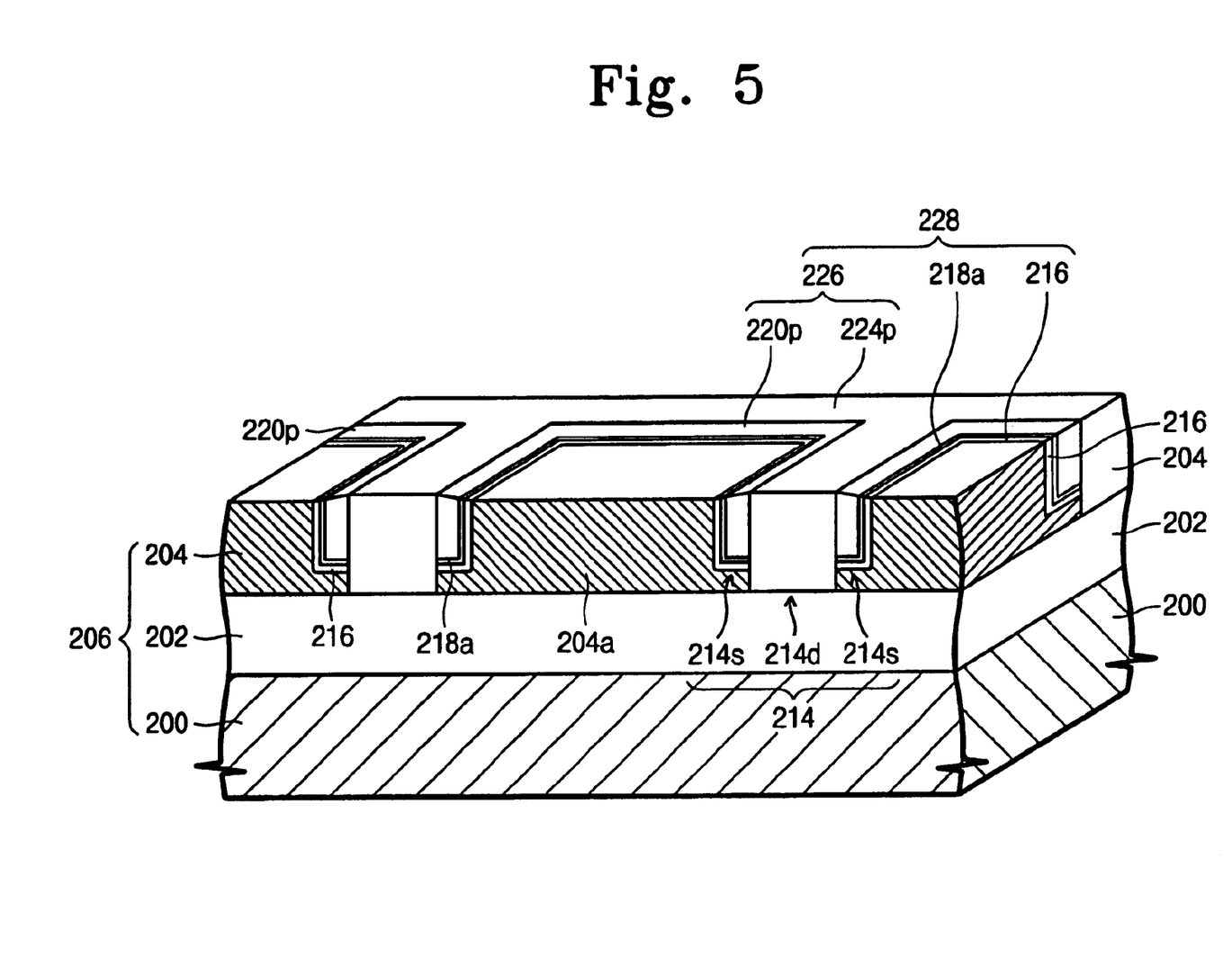
FIG. 5 is a cross-sectional view illustrating a semiconductor device in accordance with a preferred embodiment of the present invention.

FIG. 5 is a cross-sectional view illustrating a semiconductor device formed on a silicon on insulator (SOI) substrate in accordance with a preferred embodiment of the present invention.

Referring to FIG. 5, the SOI substrate is formed by sequentially stacking a buried insulating layer 202 and an upper silicon layer 204 on a base substrate 200. An isolation structure 228 is disposed at a predetermined region of the upper silicon layer 204, penetrating the upper silicon layer 204 to be in contact with the buried insulating layer 202. The isolation structure 228 fills an inside of the trench region 214 that penetrates the upper silicon layer 204. The trench region 214 includes a deep trench region 214d and a shallow trench region 214s. The deep trench region 214d is where the upper silicon layer 204 penetrates to the buried insulating layer, and the shallow trench region 214s exists at an outside of the deep trench region 214d. That is, as shown by a cross-sectional view of the trench region 214, the shallow trench region 214s corresponds to an edge of the trench region 214 and is disposed on the silicon layer. The deep trench region 214d corresponds to a center of the trench region 214 and is where the upper silicon 204 penetrates to the buried insulating layer 202.

The isolation structure 228 comprises a trench oxide layer 216, a trench liner 218a, and an insulating layer pattern 226. The trench oxide layer 216 and the trench liner 218a sequentially conformally cover both a bottom and a sidewall of the shallow trench region 214s. The trench oxide layer 216 is a thermal oxide layer obtained by oxidation of silicon that exists in both the bottom and sidewall of the shallow trench region 214s. Thus, the trench liner 218a conformally covers both the bottom and sidewall of the shallow trench region 214s where the trench oxide layer 216 is formed. The insulating layer pattern 226 is formed of a sidewall insulating layer pattern 220p and a buried insulating layer pattern 224p. The sidewall insulating layer pattern 220p fills the edge of the trench region 214, i.e., the shallow trench region 214s and the buried insulating layer pattern 224p fills the deep trench region 214d surrounded by the sidewall insulating layer pattern 220p. The sidewall insulating layer pattern 220p in contact with the upper sidewalls of the buried insulating layer pattern 224p fills the edge of the trench region 214, i.e., the shallow-trench region 214s. The lower sidewalls and the bottom of the buried insulating layer pattern 224p are in contact with the upper silicon layer 204 and the buried insulating layer pattern 226, respectively. The bottom and one of the sidewalls of the sidewall insulating layer pattern 220p are in contact with the trench liner 218a.

According to the present invention, the bottom and the sidewall of the upper silicon layer 204 are surrounded by the isolation structure 228 such that the upper silicon layer 204 forms an island-shaped structure. The island-shaped upper silicon layer 204 corresponds to an active region.

Unlike the conventional method as described above, according to the present invention, the trench oxide layer 216 is formed on an upper portion of the trench region 214, i.e., the sidewall and the bottom of the shallow trench region 214s. The thermal oxide layer does not exist at an interface between the buried insulating layer 202 of the lower portion of the trench region 214 and the silicon layer 204. Thus, since the upper silicon layer 204 does not suffer defects due to bending and misoperation of the semiconductor device, and leakage current can be remarkably reduced.

FIGS. 6 through 12 are cross-sectional views illustrating a method of fabricating the trench isolation structure on the SOI substrate in accordance with the preferred embodiment of the present invention.

Figure 6:
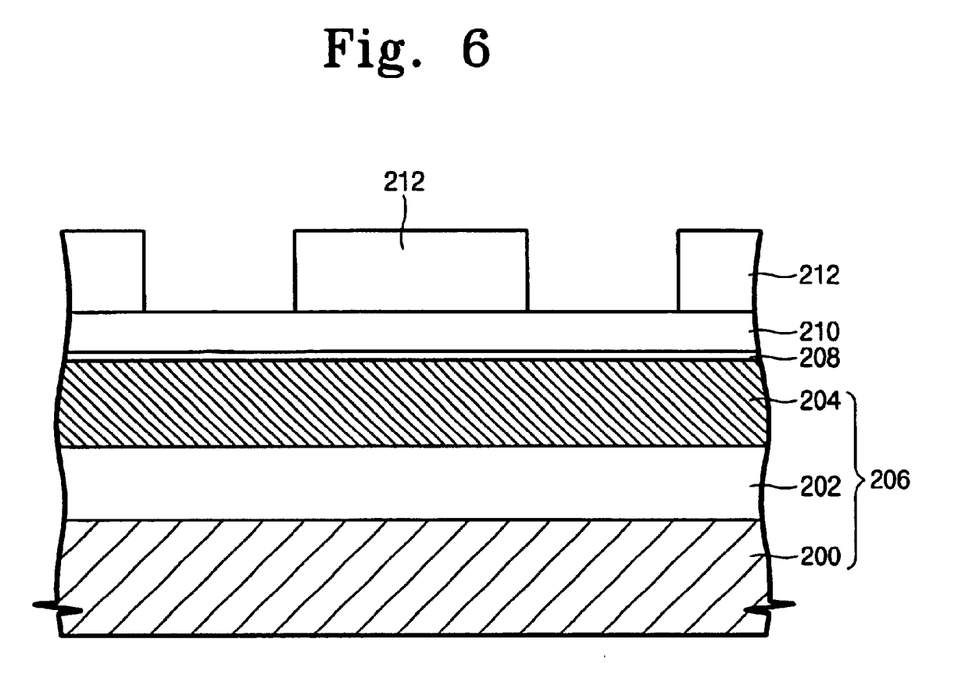
FIGS. 6 through 12 are cross-sectional views illustrating a method of fabricating the semiconductor device in accordance with the preferred embodiment of the present invention.

Referring to FIG. 6, a buffer oxide layer 208 and a hard mask layer 210 are sequentially formed on the SOI substrate 206, which is formed by stacking the buried insulating layer 202 and the upper silicon layer 204 on the base substrate 200. The buffer oxide layer 208 may be a CVD oxide layer or a thermal oxide layer. The hard mask layer 210 is preferably an insulating layer having selectivity with respect to a silicon layer, for example, a silicon nitride layer. A photoresist pattern 212 is formed to expose a predetermined region of the hard mask layer 210 on the hard mask layer 210. In a subsequent step, an isolation structure will be formed on the semiconductor substrate under the exposed region.

Figure 7:
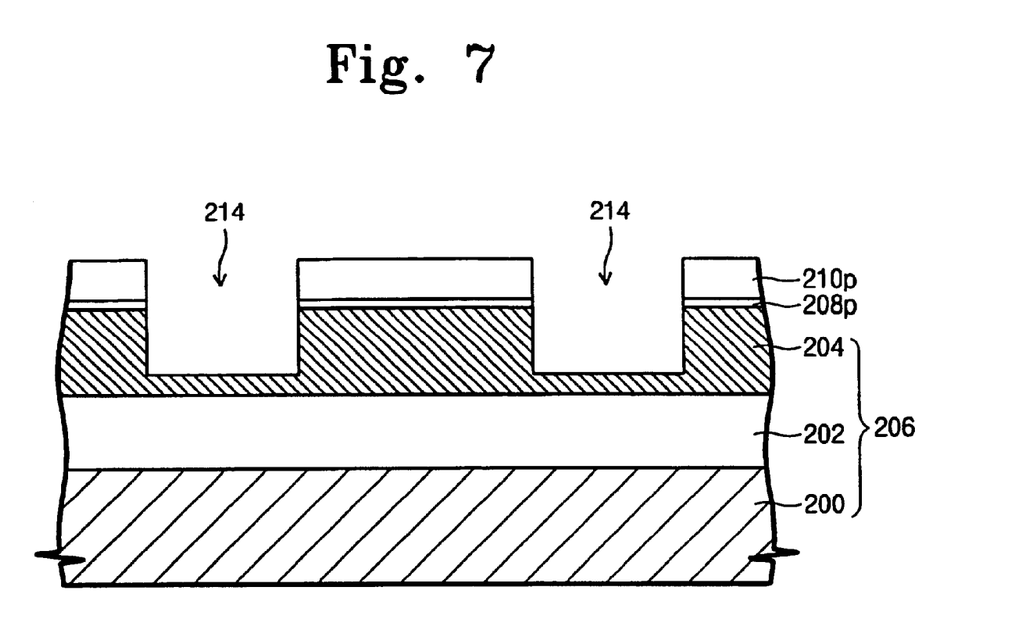

Referring to FIG. 7, using the photoresist pattern 212 as an etch mask, the hard mask layer 210, the buffer oxide layer 208, and the upper silicon layer 204 of a predetermined thickness are etched. Thus, a trench region 214 is formed on the upper silicon layer 204, and a buffer oxide layer pattern 208p and a hard mask pattern 210p are sequentially formed on the upper silicon layer 204. The photoresist pattern 212 is removed to expose a top surface of the hard mask pattern 210p. Alternatively, after the hard mask pattern 210p and the buffer oxide layer pattern 208p are formed, the photoresist pattern 212 is removed, then the upper silicon layer 204 is etched using the hard mask pattern 210p as an etch mask. At this time, the trench region 214 does not completely penetrate the upper silicon layer 204 such that a bottom of the trench region 214 is in the upper silicon layer 204. It is preferable that the upper silicon layer of 100 to 1000 Å remains between the bottom of the trench region 214 and the buried insulating layer 202.

Figure 8:
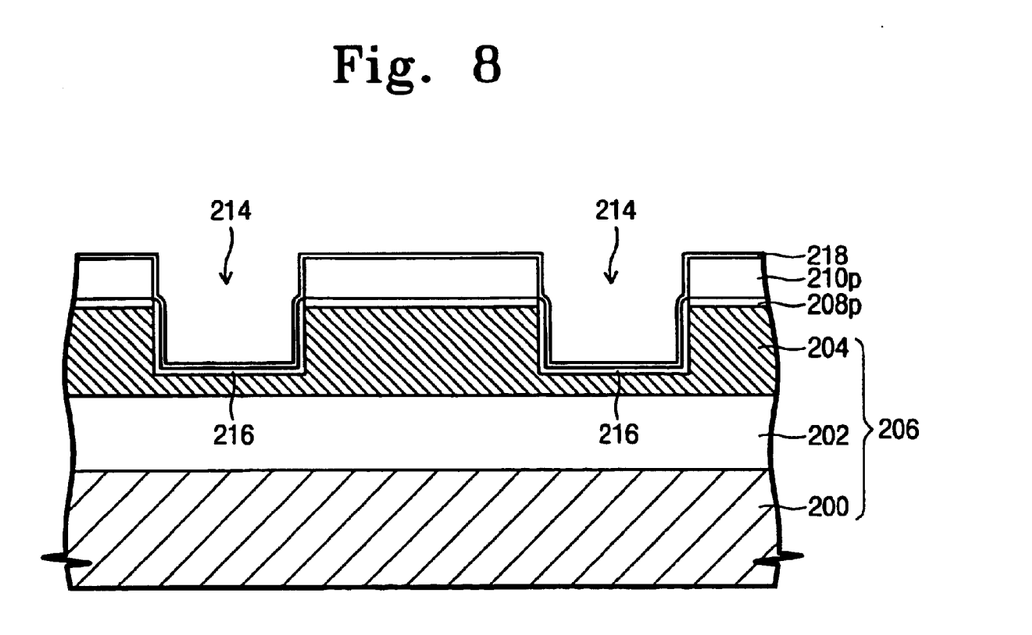

Referring to FIG. 8, the resultant structure where the trench region 214 is formed is annealed to cure defects of the upper silicon layer 204 that occurred while etching the upper silicon layer 204 for forming the trench region 214. The annealing is preferably done in an oxygen ambient, resulting in formation of a trench oxide layer 216 on the sidewall and the bottom of the trench region 214. It is preferable that the trench oxide layer 216 be formed to a thickness of 50 to 500 Å on the sidewall and the bottom of the trench region 214. The trench oxide layer 216 is a thermal oxide layer obtained by oxidation of silicon that exists in the sidewall and the bottom of the trench region 214. A trench liner layer 218 is conformally formed on an entire surface of the resultant structure where the trench oxide layer 216 is formed. The trench liner layer 218 is preferably a silicon nitride layer of 20 to 200 Å.

As described above, according to the conventional method, the trench oxide layer 116 (in FIG. 3) is formed on the sidewall of the trench region 114 that completely penetrates the upper silicon layer 104 (in FIG. 3) as shown in FIG. 3. This causes atoms of oxygen to be diffused into an interface between the upper silicon layer and the buried insulating layer 102 (in FIG. 3). Therefore, the upper silicon layer is oxidized such that tension due to expansion is applied to the upper silicon layer. This leads to bending of the upper silicon layer, thus causing stress induced defects to the upper silicon layer. That is, annealing for curing the etching induced defects results in other defects, i.e., the stress induced defects.

According to the present invention, however, the trench oxide layer 216 is formed on the trench region 214 that does not completely penetrate the upper silicon layer 204. Accordingly, the upper silicon layer 204 is not bent while forming the trench oxide layer 216. This enables not only prevention of the stress induced defects, but also curing of the etching induced defects.

Figure 9:
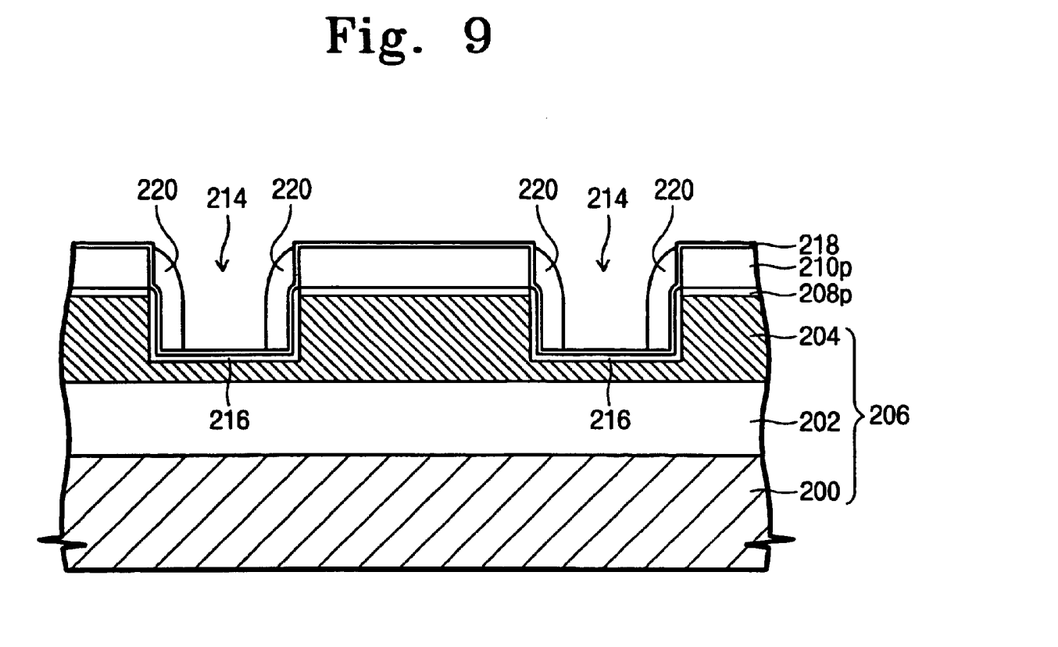

Referring to FIG. 9, a spacer insulating layer is conformally formed on an entire surface of the semiconductor substrate where the trench liner layer 218 is formed. The spacer insulating layer is preferably a silicon oxide layer. Shown by a cross-sectional view of the trench region 214, the spacer insulating layer is preferably formed to a thickness less than ½ of a minimum width of the trench region 214. Thereafter, the spacer insulating layer is etched using an anisotropic etch process to form a trench spacer 220 covering an edge of the trench region 214. The trench spacer 220 covers the sidewall of the trench region 214, a sidewall of the buffer oxide layer pattern 208p, and a sidewall of the hard mask pattern 210p.

Figure 10:
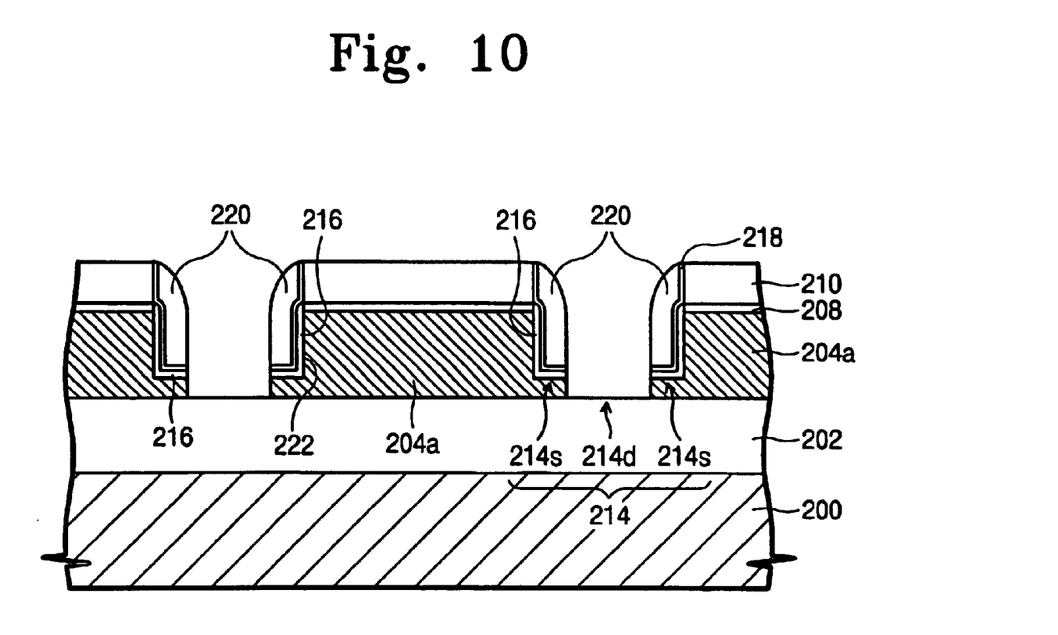

Referring to FIG. 10, using the trench spacer 220 as an etch mask, the trench liner layer on both the bottom of the trench region 214 and the top of the hard mask pattern 210p is etched. Both the trench oxide layer 216 and the upper silicon layer 204 on the bottom of the trench region 214 are etched by using the trench spacer 220 and the hard mask pattern 210p as an etch mask such that the buried insulating layer is exposed. As a result, the deep trench region 214d is formed in the trench region 214. That is, shown by the cross-sectional view of the trench region 214, the edge of the trench region 214 corresponds to the shallow trench region 214s, and the region where the buried insulating layer 202 is exposed between the shallow trench regions 214d corresponds to the deep trench region 214d. The trench oxide-layer 216 and the trench liner layer 218 are formed not on the sidewall of the deep trench region 214d, but on the bottom and the sidewall of the shallow trench region 214s. In addition, the trench spacer 220 covers the shallow trench region 214s.

Figure 11:
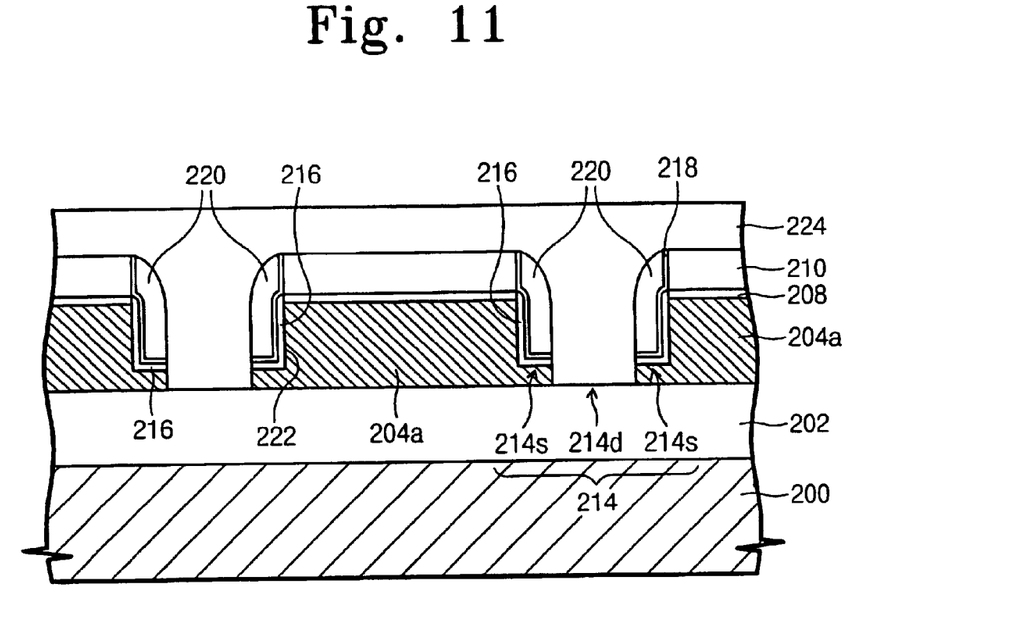

Referring to FIG. 11, a gap fill insulating layer 224 is formed to fill the trench region 214 on an entire surface of the resultant structure where the deep trench region 214d is formed. The gap fill insulating layer 224 may be either an $O_3$-TEOS oxide layer, a PEOX layer, or an HDP CVD oxide layer whose step coverage is good. Preferably, the gap fill insulating layer is the HDP CVD layer.

Figure 12:
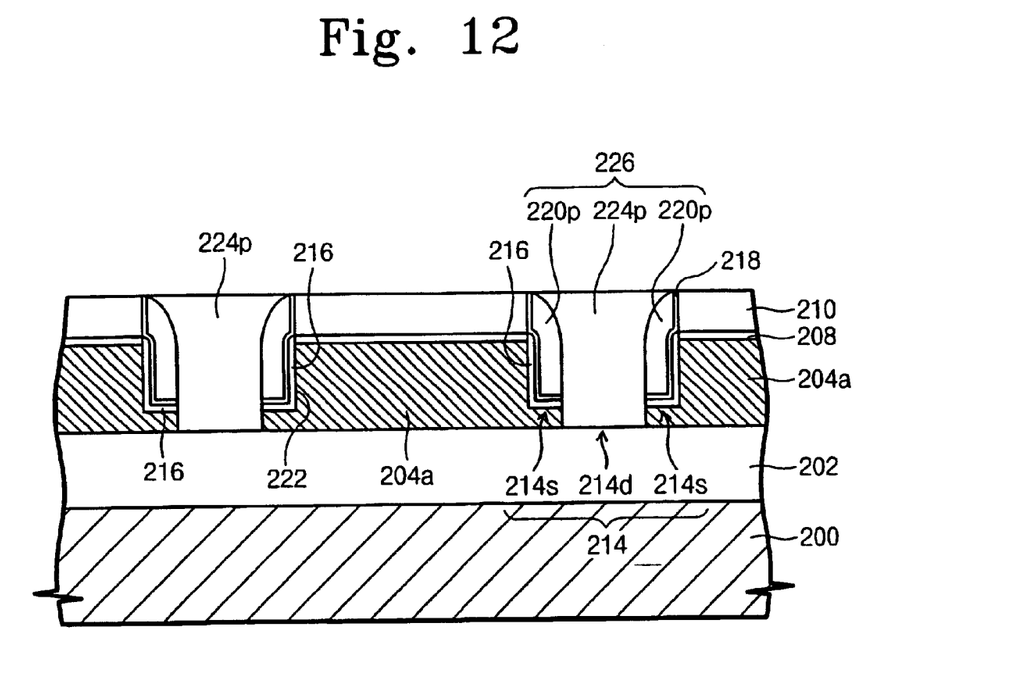

Referring to FIG. 12, the gap fill insulating layer 224 and the top of the trench spacer 220 are polished by chemical mechanical polishing (CMP). In the polishing step, the hard mask pattern 210p is exposed and an insulating layer pattern 226 is formed to fill the trench region 214. The insulating layer pattern 226 is formed of a gap fill insulating layer pattern 224p and a sidewall insulating layer pattern 220p. The gap fill insulating layer pattern 224p fills the deep trench region 214d, and the sidewall insulating layer pattern 220p fills the edge of the trench region 214, i.e., the shallow trench region 214s. In Ceria CMP using cerium as a slurry, the hard mask layer 210 can be thinly formed to a thickness of about 500 to 1000 Å. Since the Ceria CMP may increase a polishing rate of an oxygen layer to a silicon nitride layer, an over-etching of the hard mask pattern 210p may be prevented.

Consequently, the isolation structure 228 is formed on the SOI substrate 206 to penetrate the upper silicon layer 204 in contact with the buried insulating layer 202. The trench oxide layer 216, the trench liner 218, and the insulating layer pattern 226 constitute the isolation structure 228. The isolation structure 228 fills an inside of the trench region 214 that comprises the deep trench region 214d and the shallow trench region 214s existing at an outside of the deep trench region 214d. In addition, the isolation structure 228 is in contact with the buried insulating layer pattern 226 at the bottom of the deep trench region 214d. Thus, the isolation structure 228 and the buried insulating layer 202 surround both upper and lower portions of the upper silicon layer 204 so that the upper silicon layer 204 can be isolated. The isolated upper silicon layer 204 corresponds to the active region of the semiconductor device.

Thereafter, a transistor and an integrated circuit can be fabricated on the resulting structure.

According to the present invention as described above, before the annealing process is applied, the trench region is formed not so as to completely penetrate the upper silicon layer. That is, the upper silicon layer of 100 to 1000 Å remains on the bottom of the trench region, thereby preventing the bending of the upper silicon layer.

According to the present invention, a semiconductor device of a low defect-density can be fabricated in an active region where a transistor is disposed. Therefore, both leakage current and misoperation of a device can be minimized.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of fabricating a semiconductor device on an SOI substrate formed by stacking a buried insulating layer and an upper silicon layer on a base substrate, the method comprising:

sequentially forming a buffer oxide layer and a hard mask layer on the upper silicon layer;

patterning the hard mask layer, the buffer oxide layer, and the silicon layer to a predetermined depth to form a trench region in the upper silicon layer;

thermally oxidizing a bottom and a sidewall of the trench region;

forming a trench liner that conformally-covers the bottom and the sidewall of the trench region;

patterning the trench liner layer and the upper silicon layer on the bottom of the trench to form a modified trench region including a deep trench region and a shallow trench region, the deep trench region existing where the buried insulating layer is exposed, the shallow trench region existing at an outside of the deep trench region;

forming an insulating layer pattern filling an inside of the modified trench region; and removing the hard mask layer and the buffer oxide layer remaining on the upper silicon layer.

2. The method as claimed in claim 1, wherein the step of forming the insulating layer pattern comprises:

forming a gap fill insulating layer filling the modified trench region on an entire surface of the SOI substrate; and planarizing the gap fill insulating layer to form an insulating layer pattern exposing the hard mask layer on top of upper silicon layer and also filling the inside of the modified trench region.

3. The method as claimed in claim 2, wherein the gap fill insulating layer is a high density plasma (HDP) chemical vapor deposition (CVD) layer.

4. The method as claimed in claim 2, wherein the gap fill insulating layer is planarized by chemical mechanical polishing (CMP).

5. The method as claimed in claim 1, wherein the step of forming the modified trench region comprises:

conformally forming a spacer insulating layer on an entire surface of the resultant structure where the trench liner layer is formed;

etching the spacer insulating layer using an anisotropic etch process to form a trench sidewall oxide layer covering an edge of the trench region; and etching the trench liner and the upper silicon layer on the bottom of the trench region using the hard mask layer on both the trench sidewall spacer and on the upper silicon layer as an etch mask to expose the buried insulating layer.

6. The method as claimed in claim 5, further comprising:

forming a gap fill insulating layer filling an inside of the modified trench region on an entire surface of the resultant structure where the buried insulating layer is exposed; and planarizing the gap fill insulating layer to form an insulating layer pattern exposing the hard mask layer on the upper silicon layer and also filling the inside of the modified trench region, wherein the insulating layer pattern is formed of a sidewall insulating layer filling an edge of the trench region and a gap fill insulating layer pattern filling the region where the buried insulating layer pattern is exposed.

7. The method as claimed in claim 5, wherein the spacer insulating layer is formed to a thickness less than ½ of a minimum width of the trench region.

8. The method as claimed in claim 5, wherein the step of forming the insulating layer pattern comprises:

forming a gap fill insulating layer filling an inside of the modified trench region on the SOI substrate; and planarizing the gap fill insulating layer and the upper portion of the trench sidewall spacer to form an insulating layer pattern, the insulating layer pattern formed of a sidewall insulating layer pattern and a gap fill insulating layer pattern, wherein the sidewall insulating layer pattern fills the shallow trench region existing at the edge of the modified trench region, wherein the gap fill insulating layer pattern fills the deep trench region of the modified trench region.

9. The method as claimed in claim 8, wherein the gap fill insulating layer is an HDP CVD layer.

10. The method as claimed in claim 8, wherein the gap fill insulating layer and the upper portion of the trench sidewall spacer are planarized by CMP.

* * * * *